United States Patent [19]
Inogai

[11] Patent Number: 5,777,908
[45] Date of Patent: Jul. 7, 1998

[54] COMB FILTER WITH A SMALLER NUMBER OF DELAY ELEMENTS

[75] Inventor: Kazunori Inogai, Yokohama, Japan

[73] Assignee: Matsushita Electric Industrial Co., Ltd., Osaka, Japan

[21] Appl. No.: 668,342

[22] Filed: Jun. 26, 1996

[30] Foreign Application Priority Data

Sep. 8, 1995 [JP] Japan .................................. 7-255755

[51] Int. Cl.⁶ ........................................ G06F 17/10
[52] U.S. Cl. ........................................ 364/724.1
[58] Field of Search .................. 364/724.1, 724.01; 375/350

[56] References Cited

U.S. PATENT DOCUMENTS

| | | | |
|---|---|---|---|
| 4,999,798 | 3/1991 | McCaslin et al. | 364/724.1 |
| 5,043,933 | 8/1991 | Boutaud et al. | 364/724.1 |
| 5,079,734 | 1/1992 | Riley | 364/724.1 |
| 5,455,782 | 10/1995 | Young et al. | 364/724.1 |
| 5,596,609 | 1/1997 | Genrich et al. | 364/724.1 |
| 5,689,449 | 11/1997 | Saramäki et al. | 364/724.1 |

OTHER PUBLICATIONS

The Transaction of the Inst. of Electronics, Info & Communication Engineers of Japan, A, vol. J74-A, No. 9, pp. 1366–1373, Sep. 1991.

IEEE Acoustics, Speech, and Signal Processing Magazine, vol. 29, No. 2, Apr. 1981, New York US, pp. 155–162, XP000560569, Eugene B. Hogenauer: "An Economical Class of Digital filters for Decimation and Interpolation".

IEEE Transactions on Circuits and Systems, vol. 31, No. 11, Nov. 1984, New York US, pp. 913–924, XP002021350, Shuni Chu et al.: "Multirate Filter Designs Using Comb Filters".

*Primary Examiner*—David H. Malzahn
*Attorney, Agent, or Firm*—Pearne, Gordon, McCoy and Granger LLP

[57] ABSTRACT

A stage associated with a factor $N_k$ of a $1/N$ ($N=N_1 \ldots N_k \ldots N_L$) thinning filter is constituted of a digital integrator which is cleared at every period of $N_{k+1}$ samples, and a transposed comb filter which operates at $1/N_1 \ldots N_k$ of an input sampling frequency and has $N/N_1 \ldots N_k$ taps. Similarly, a stage associated with a factor $N_k$ of an N-fold interpolation filter is constituted of a transposed comb filter which operates at $1/N_1 \ldots N_k$ of an output sampling frequency and has $N/N_1 \ldots N_k$ taps, and a hold circuit for holding output data of the transposed comb filter for a period of $N_{k+1}$ samples.

3 Claims, 13 Drawing Sheets

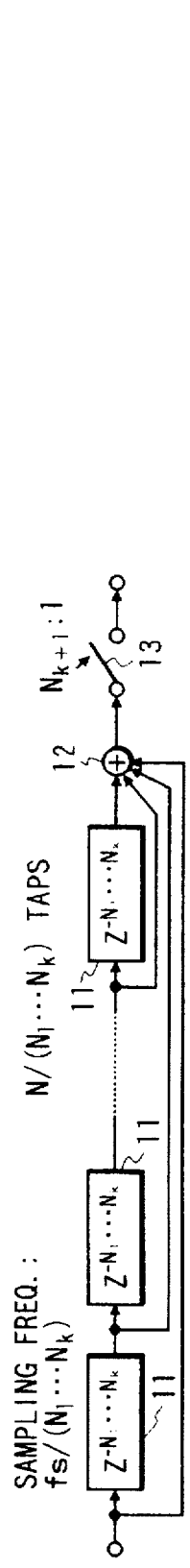
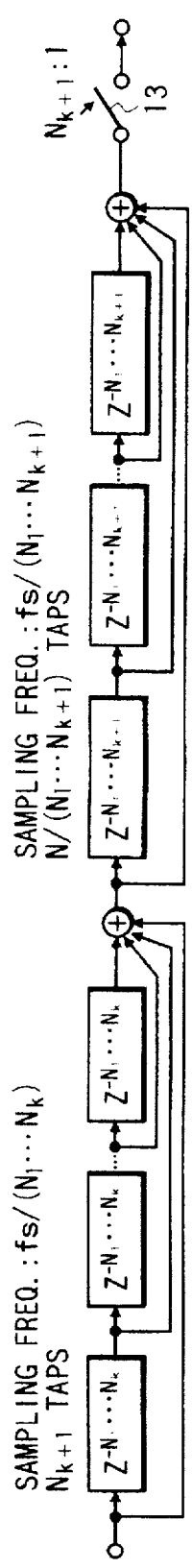
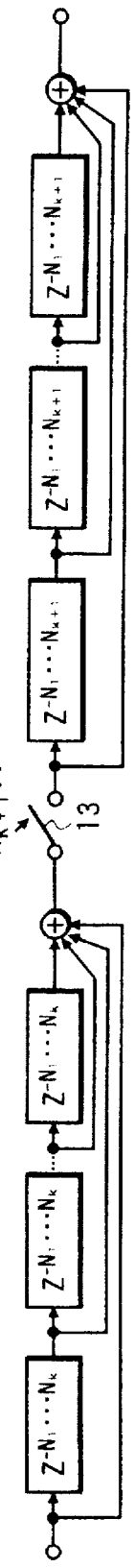
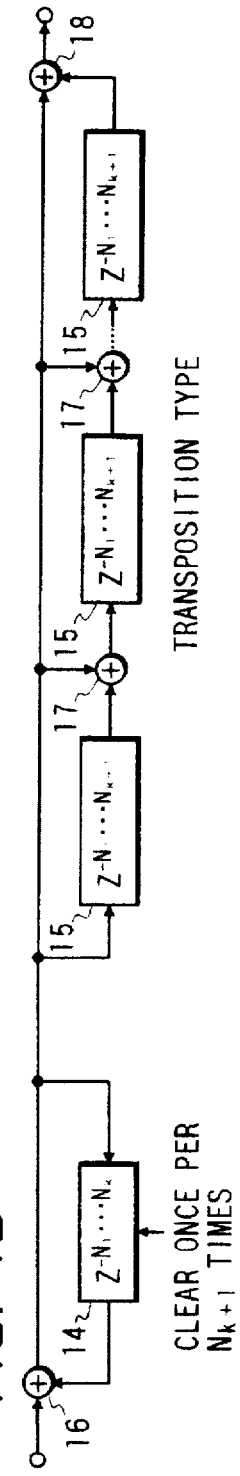

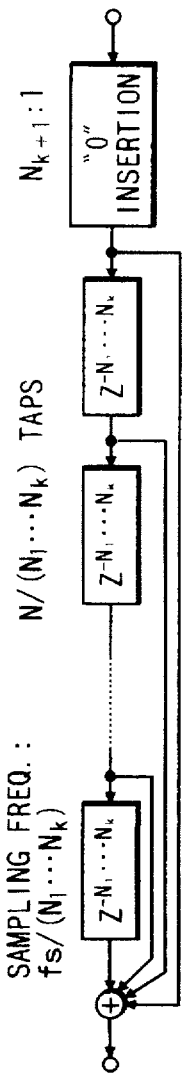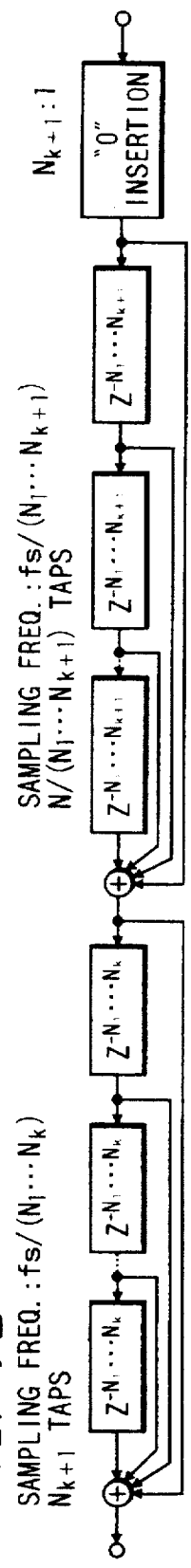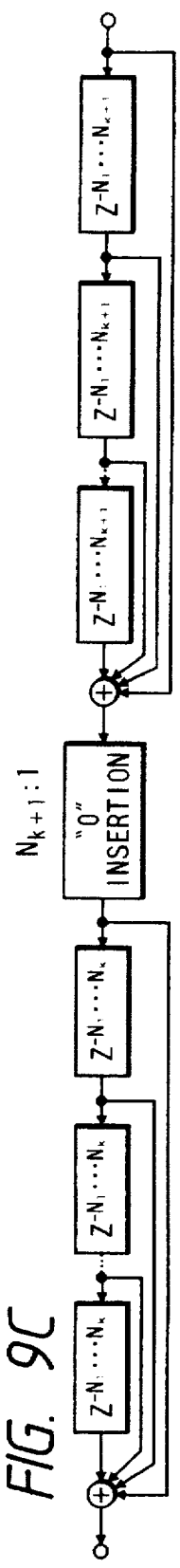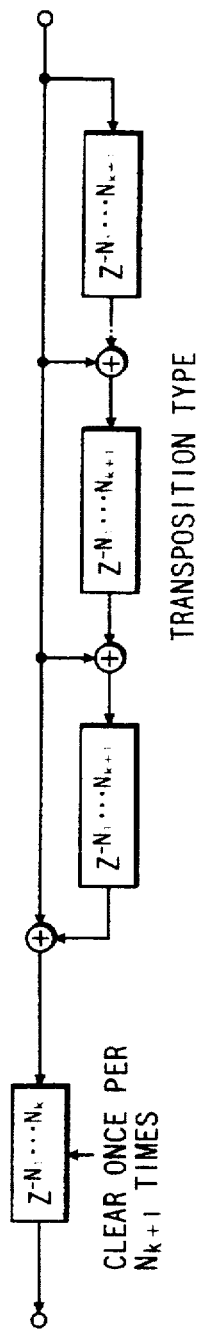
FIG. 9A PRIOR ART
FIG. 9B
FIG. 9C
FIG. 9D

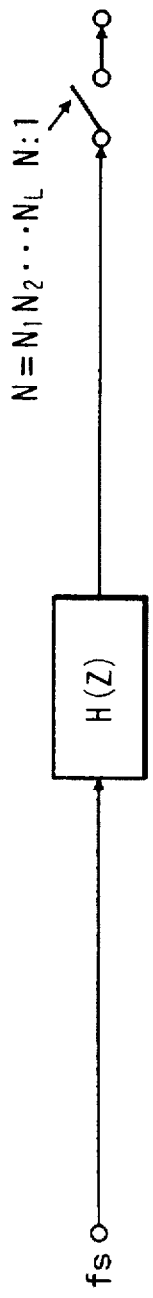
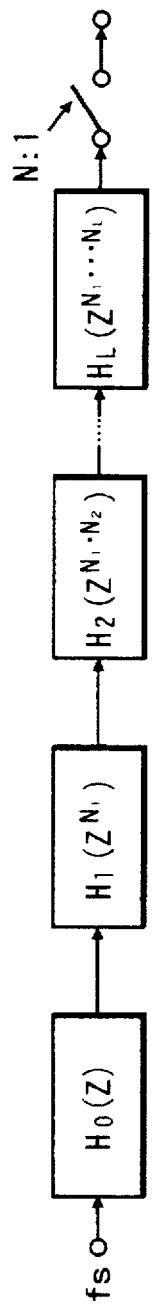
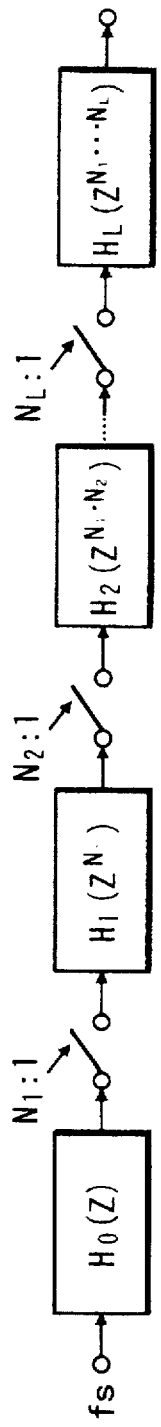
FIG. 12A PRIOR ART
FIG. 12B PRIOR ART
FIG. 12C PRIOR ART

COMB FILTER WITH A SMALLER NUMBER OF DELAY ELEMENTS

BACKGROUND OF THE INVENTION

1. Field of the Invention

The present invention relates to a comb filter used in a thinning filter and an interpolation filter as well as to a transceiver for mobile communication which incorporates the comb filter. In particular, the invention is intended to reduce the size and the power consumption of a comb filter, to thereby provide a lightweight, power-saving-type transceiver.

2. Description of the Related Art

As for mobile transceivers for digital mobile communication, studies are now being made to use a Δ-Σ A/D (D/A) converter for 1-bit A/D (D/A) conversion to A/D-convert a reception signal or D/A-convert a transmission signal. In the 1-bit Δ-Σ A/D conversion, an analog signal is converted into 1-bit compressional wave data. In the 1-bit Δ-Σ D/A conversion, an analog signal is produced from averages of 1-bit compressional wave data.

More specifically, in the A/D conversion, a digital signal (compressional wave) is produced such that an input signal is sampled at a sufficiently high sampling frequency and 0/1 data is produced by performing a judgment on a difference between target data and the preceding data. This judgment can be made correctly because it suffices that the judgment accuracy be only one bit. The sampling frequency is set as high as about 14.4 MHz, for instance.

In a receiver, the frequency of an A/D-converted signal needs to be returned to an ordinary sampling frequency of digital signal processing. To this end, the signal is thinned out with a thinning filter.

In a transmitter, conversely, a signal is subjected to interpolation with an interpolation filter, to provide a high-sampling-frequency signal to a Δ-Σ D/A converter. The Δ-Σ D/A converter generates an analog signal based on the interpolated signal, and the resulting analog signal is transmitted.

FIG. 14 shows a receiving circuit using a Δ-Σ A/D converter, and FIG. 15 shows a transmitting circuit using a Δ-Σ D/A converter. In the receiving circuit, an A/D-converted signal is subjected to quadrature detection and then thinned out with a thinning filter. In the transmitting circuit, data is interpolated with an interpolation filter, then subjected to quadrature modulation, and finally D/A-converted into an analog signal.

Each of the above thinning filter and the interpolation filter is constituted of a plurality of cascade-connected comb filters. A thinning filter having a proper combination of comb filters can suppress signals on an adjacent channel, a second adjacent channel, etc. which signals cannot be suppressed sufficiently by an RF filter of the receiving circuit.

In principle, as shown in FIG. 16, such a thinning filter is realized by two FIR filters $Hf(z)$ and $Hs(z^N)$ (symbol $z^N$ means an N-fold sampling interval) having different sampling intervals are cascade-connected so that notches of one filter are located at maximums of the other on their gain-frequency characteristics, followed by suppression of unnecessary portions of a gain-frequency characteristic of a synthesized filter $H(z)$.

In FIG. 16, it is assumed that the filter $Hf(z)$ is a 4-tap comb filter of a sampling frequency fs and the filter $Hs(z^N)$ is a 5-tap triangular-wave filter of a sampling frequency fs/4. Time-axis (t-axis) waveforms shown in FIG. 16 are impulse responses of the respective filters. The filters $Hf(z)$ and $Hs(z^N)$ have impulse response lengths of 4/fs and 16/fs, respectively. The notch frequencies of the filter $Hf(z)$ are integral multiples of fs/4, which is an inverse of the impulse response length (excluding integral multiples of fs). The notch frequencies of the filter $Hs(z^N)$ are integral multiples of fs/16, which is an inverse of the impulse response length (excluding integral multiples of fs/4). In the gain-frequency characteristic of the cascade-connected filter $H(z)$, which is a sum of the gain-frequency characteristics of the filters $Hf(z)$ and $Hs(z^N)$, the notches of $Hf(z)$ suppress the repetitive peaks of Hs $(z^N)$ at integral multiples of the sampling frequency fs/4.

FIGS. 12A–12C show the principle of a digital thinning filter. FIG. 12A shows an ordinary thinning filter $H(z)$ that is inserted to prevent aliasing noise from occurring in the thinning. After the filter $H(z)$ performs filtering at an input sampling frequency fs to narrow the bandwidth to $fs_0/2$ or less, 1/N thinning is performed to produce a signal of an output sampling frequency $fs_0$ (=fs/N).

If factorization $N=N_1N_2 \ldots N_L$ is possible, the filter $H(z)$ can be a cascade connection of filters $H_0(z)$, $H_1(z^{N1})$, $H_2(z^{N1 \cdot N2})$, ..., $H_L(z^{N1 \cdots NL})$ having different coefficient sampling frequencies, as shown in FIG. 12B. The impulse response length of each of these filters is made $fs^{-1}=N \cdot fs_0^{-1}$, and the final-stage filter $H_L(z^{N1 \cdots NL})$ of $fs_0$ is given deepest notches. Further, since these filters are FIR filters, an equivalent filter is obtained even by inserting a thinner into each stage as shown in FIG. 12C. As a result, it suffices that the filter of each stage operate at its coefficient sampling frequency. The filter of each stage is constituted by a comb filter.

Conventionally, as shown in FIG. 1A, the comb filter of each stage, $H_k(z^{N1 \cdots NL})$, k=0, ..., L, is composed of $N/N_1N_2 \ldots N_k-1$ delay elements $Z^{-P}$ ($p=N_1N_2 \ldots N_k$), an adder 12 for adding outputs of the respective delay elements 11 to input data, and a thinner 13 for thinning out output data of the adder 12 at a ratio of $N_{k+1}$:1. The delay element $Z^{-P}$, which is a cascade connection of p delay elements $Z^{-1}$ of one sampling interval, delays input data by p sampling intervals. This filter has $N/N_1N_2 \ldots N_k$ taps.

The comb filter $H_k(z^{N1 \cdots Nk})$ receives data of a sampling frequency $fs/N_1N_2 \ldots N_k$, because the frequency fs of an input signal to the thinning filter has been thinned by the thinners of the prior stages.

Input data is input to the adder 12 and the first delay element 11. The input data is delayed by the first delay element 11 by one sampling interval of the input sampling frequency $fs/N_1N_2 \ldots N_k$, and delayed data is input to the next delay element 11 and the adder 12. This type of operation is performed for each delay element 11, and the adder 12 adds up data of a number equal to the number $N/N_1N_2 \ldots N_k$ of taps at each sampling cycle. The thinner 13 outputs one data to the comb filter $H_{k+1}(z^{N1 \cdots Nk+1})$ of the next stage every time the adder 12 outputs $N_{k+1}$ data.

On the other hand, as shown in FIG. 13A, a digital interpolation filter multiplies a sampling frequency by N by inserting, into an input signal, N−1 samples of data "0" per one sample of the input signal. Then, an interpolation filter $H(z)$ performs filtering to suppress unnecessary spectrum components appearing at integral multiples of an input sampling frequency $fs_i$, to produce an output sampling frequency $fs_o$ (=N×$fs_i$).

If factorization $N=N_1N_2 \ldots N_L$ is possible, as in the case of the thinning filter, the filter $H(z)$ can be a cascade connection of filters $H_0(z)$, $H_1(z^{N1})$, $H_2(z^{N1 \cdot N2})$, ..., $H_L(z^{N1}$ ... NL) having different coefficient sampling frequencies (see FIG. 13B). The impulse response length of each of these filters is made $fs_i^{-1}=N \cdot fs_o^{-1}$, and the final-stage filter $H_L(z^{N1 \cdots NL})$ of $fs_o$ is given deepest notches.

Further, since these filters are FIR filters, an equivalent filter is obtained even by inserting a thinner into each stage as shown in FIG. 13C. As a result, it suffices that the filter of each stage operate at its coefficient sampling frequency.

The comb filter of each stage, $H_k(z^{N1 \cdots Nk})$, k=0, ..., L, has a configuration shown in FIG. 9A. Although this comb filter is different from that of FIG. 1A in that the 0-insertion element is substituted for the thinner, the filter configuration and data that are input to the respective delay elements and the adders are the same.

However, since the comb filter used in the conventional thinning filter and the interpolation filter is required to execute a number of additions at high speed, it should satisfy high-level requirements on hardware. Further, since the additions consume a large amount of power, the comb filter will shorten the life of a battery of a transceiver of mobile communication, for instance.

In addition, the use of a large number of parts makes it difficult to reduce the weight and size of a mobile transceiver.

SUMMARY OF THE INVENTION

The present invention has been made to solve the above problems, and therefore has an object of providing a comb filter which is constituted of a smaller number of components and in which a smaller number of calculations are performed. Another object of the invention is to provide a compact, lightweight transceiver with reduced power consumption by incorporating the above comb filter therein.

According to the invention, there is provided a comb filter for use in a stage associated with a factor $N_k$ of an 1/N thinning filter where N is factorized such that $N=N_1 \ldots N_k \ldots N_L$, comprising:

- a digital integrator with a discharge function which is cleared every time it adds up input data for a period of $N_{k+1}$ samples; and
- a transposed comb filter which is provided downstream of and in cascade to the digital integrator, and operates at $1/N_1 \ldots N_k$ of an input sampling frequency of the thinning filter.

There is also provided a comb filter for use in a stage associated with a factor Nk of an N-fold interpolation filter where N is factorized such that $N=N_1 \ldots N_k \ldots N_L$, comprising:

- a transposed comb filter which operates at $1/N_1 \ldots N_k$ of an output sampling frequency of the interpolation filter; and
- a hold circuit provided in cascade to the transposed comb filter, for holding output data of the transposed comb filter for a period of $N_{k+1}$ samples.

Further, there is provided a transceiver which repeats receiving and transmitting operations alternately, comprising in a stage associated with a factor $N_k$ of a 1/N thinning/N-fold interpolation filter where N is factorized such that $N=N_1 \ldots N_k \ldots N_L$:

- a transposed comb filter which operates at $1/N_1 \ldots N_k$ of a reception or transmission sampling frequency, and which is commonly used for the receiving and transmitting operations;
- a digital integrator with a discharge function which acts as an integrator that is cleared every time it adds up input data for a period of $N_{k+1}$ samples during the receiving operation, and acts as a hold circuit for holding output data of the transposed comb filter for a period of $N_{k+1}$ samples during the transmitting operation; and
- switching means for causing an input signal to flow so as to be supplied first to the digital integrator and then to the transposed comb filter during the receiving operation, and flow in an opposite direction during the transmitting operation.

By constructing the stage associated with the factor Nk of a 1/N thinning filter by the digital integrator which is cleared at every period of $N_{k+1}$ samples and the transposed comb filter which operates at $1/N_1 \ldots N_k$ of the input sampling frequency and has $N/N_1 \ldots N_k$ taps, both of the amount of hardware and the power consumption can be reduced to 1/N particularly when N is so large that the contribution of the digital integrator is negligible. Similarly, by constructing the stage associated with the factor $N_k$ of an N-fold interpolation filter by the transposed comb filter which operates at $1/N_1 \ldots N_k$ of the output sampling frequency and has $N/N_1 \ldots N_k$ taps and the hold circuit for holding output data of the transposed comb filter for a period of $N_{k+1}$ samples, both of the amount of hardware and the power consumption can be reduced to 1/N particularly when N is so large that the contribution of the hold circuit is negligible. Therefore, in either case, the chip area of a chip as an implementation of the comb filter as well as the power consumption can be reduced.

Further, by commonly using the above comb filter for a thinning filter and an interpolation filter of a transceiver, the amount of hardware can be reduced, thereby enabling provision of a compact, lightweight transceiver.

BRIEF DESCRIPTION OF THE DRAWINGS

FIGS. 1A–1D show the configuration of a comb filter according to a first embodiment of the present invention;

FIGS. 9A–9D show the configuration of a comb filter according to a second embodiment of the invention;

FIGS. 12A–12C show the principle of a thinning filter;

DESCRIPTION OF THE PREFERRED EMBODIMENTS

Embodiment 1

A comb filter according to a first embodiment of the present invention is used in a thinning filter. This comb filter has been conceived based on the following considerations.

A conventional filter of FIG. 1A can be converted into a cascade connection of a comb filter having a sampling frequency $fs/N_1 \ldots N_k$ and $N_{k+1}$ taps and a comb filter having a sampling frequency $fs/N_1 \ldots N_{k+1}$ and $N/N_1 \ldots N_{k+1}$ taps, as shown in FIG. 1B.

Figure 2A:
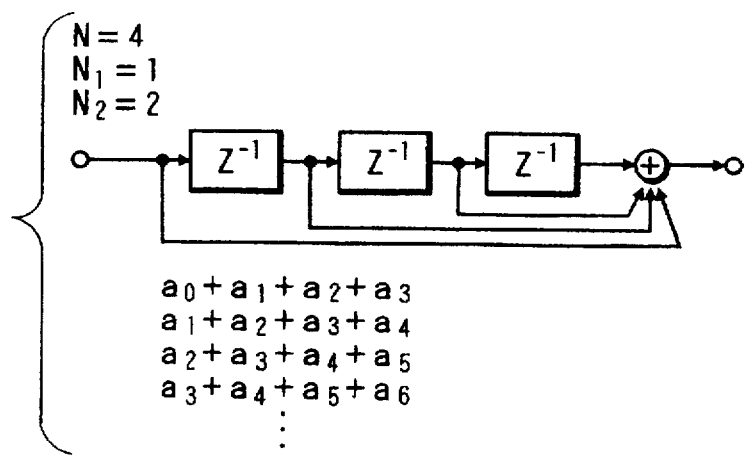
FIGS. 2A and 2B and 3 illustrate the operation of the comb filter of the first embodiment.
Figure 2B:
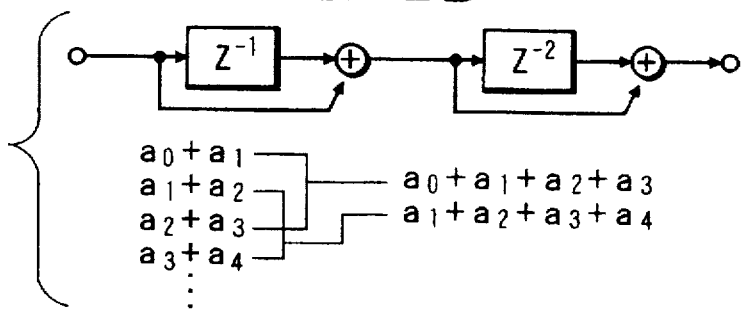

For example, where $N=4$, $N_1=1$, and $N_2=2$, either of the filters shown in FIGS. 2A and 2B produces outputs $a_0+a_1+a_2+a_3$, $a_1+a_2+a_3+a_4$, and $a_2+a_3+a_4+a_5$ for input data $a_0$, $a_1$, $a_2$, . . . .

Further, the filter of FIG. 1B can be converted into a filter of FIG. 1C by interchanging the comb filter having the sampling frequency $fs/N_1 \ldots N_{k+1}$ and the $1/N_{k+1}$ thinner 13.

Figure 3:
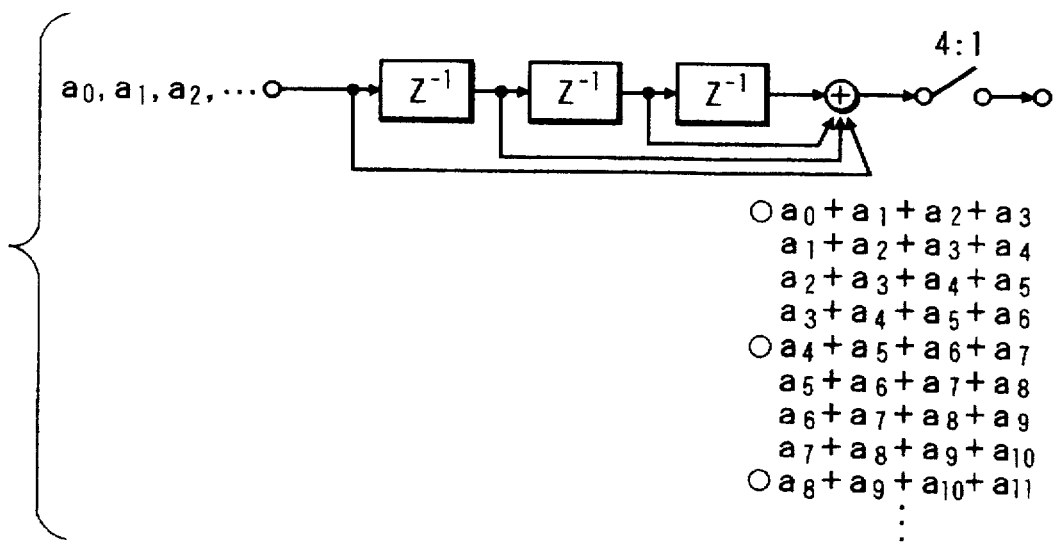

In the front-stage comb filter of the filter of FIG. 1C, both of the number of taps and the thinning parameter are $N_{k+1}$. In this case, as shown in FIG. 3, the thinner 13 produces outputs $a_0+a_1+a_2+a_3$, $a_4+a_5+a_6+a_7$, $a_8+a_9+a_{10}+a_{11}$, . . . , which have no overlaps of input values.

As shown in FIG. 1D, this type of operation can be realized by a digital integrator 14 with a discharge function which is cleared every time $N_{k+1}$ input data are summed up.

Further, as shown in FIG. 1D, the rear-stage comb filter of the filter of FIG. 1C can be replaced by a transposed configuration consisting of delay elements 15 and adders 17 and 18. This transposed comb filter performs a pipeline operation in which a calculation result of each stage is forwarded to the next stage. Therefore, the number of data to be summed up at a time in each of the adders 17 and 18 is reduced, to thereby lower the load of calculation on each adder.

Thus, in this embodiment, the comb filter is formed by the digital integrator 14 with a discharge function and the transposed comb filter, as shown in FIG. 1D. In the comb filter of FIG. 1D, the number of delay elements is equal to the number $N/N_1 \ldots N_{k+1}-1$ of delay elements 15 plus one (digital integrator 14), which is much smaller than the number $N/N_1 \ldots N_k-1$ of delay elements 11 of the conventional comb filter of FIG. 1A. Therefore, the area a chip as an implementation of the comb filter of FIG. 1D can be made small.

Further, since the transposed comb filter, which occupies a large part of the circuit, operates at a sampling frequency that is lowered by a factor of $1/N_{k+1}$, the power consumption can also be reduced.

Figure 4:
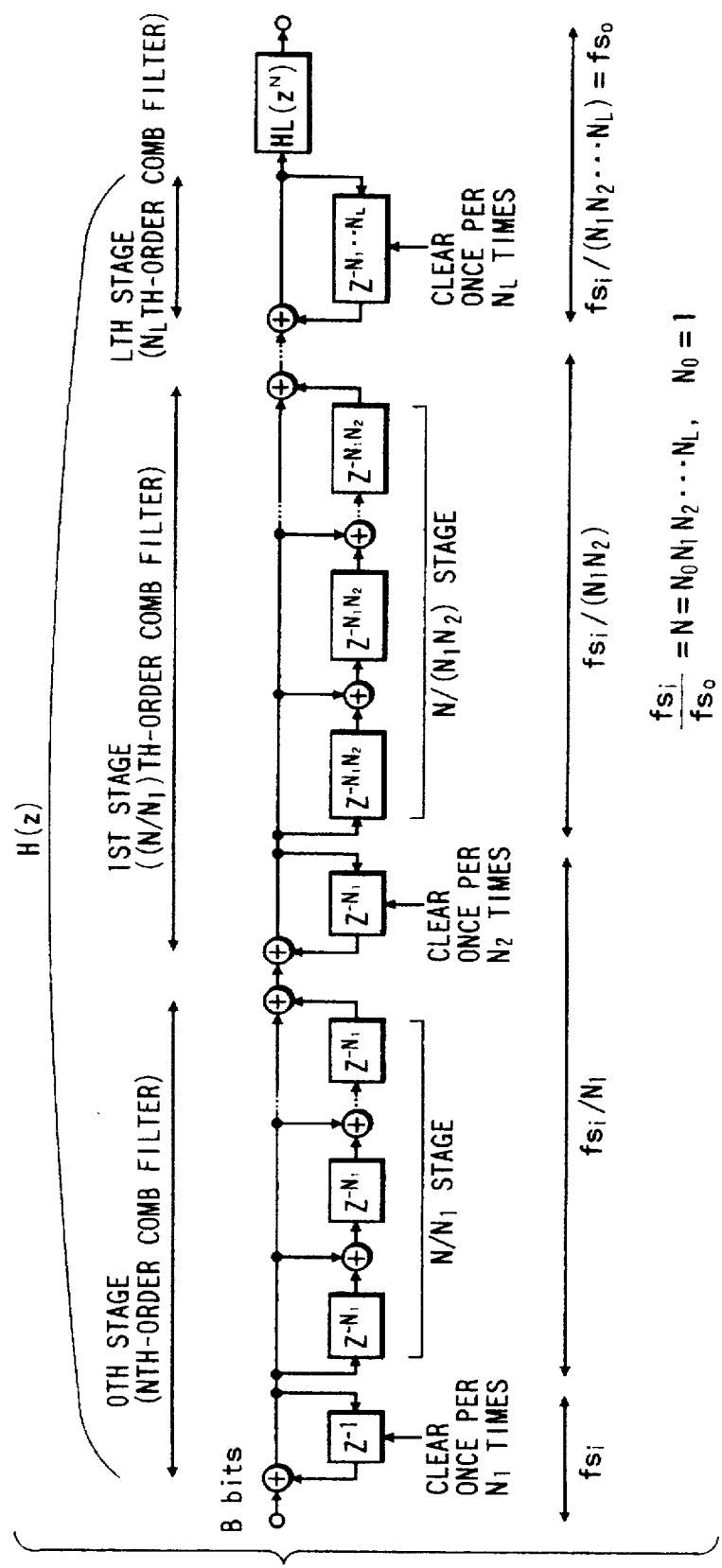
FIG. 4 shows the configuration of a thinning filter which uses the comb filters of the first embodiment.

FIG. 4 shows an example in which the comb filter of this embodiment is used in a thinning filter: each of the 0th to Lth stages of the thinning filter is constituted by the above comb filter. This thinning filter is formed by determining the number L of cascade connection stages of comb filters, factorizing N ($=fs/fs_0$) into L factors $N_1$, $N_2$, . . . , $N_L$, and selecting one of the combinations of the factors which minimizes the hardware. A DSP (digital signal processor) having a multiplier can be used at the final stage that is required to have the steepest characteristic, because the sampling frequency is lowest at the final stage.

Figure 5:
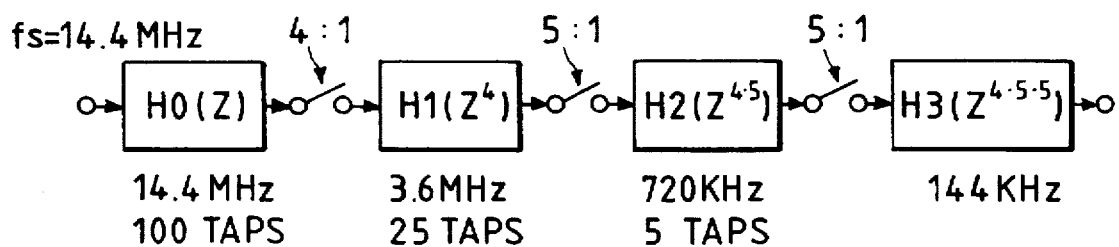
FIG. 5 shows a specific example of the thinning filter of FIG. 4.
Figure 6:
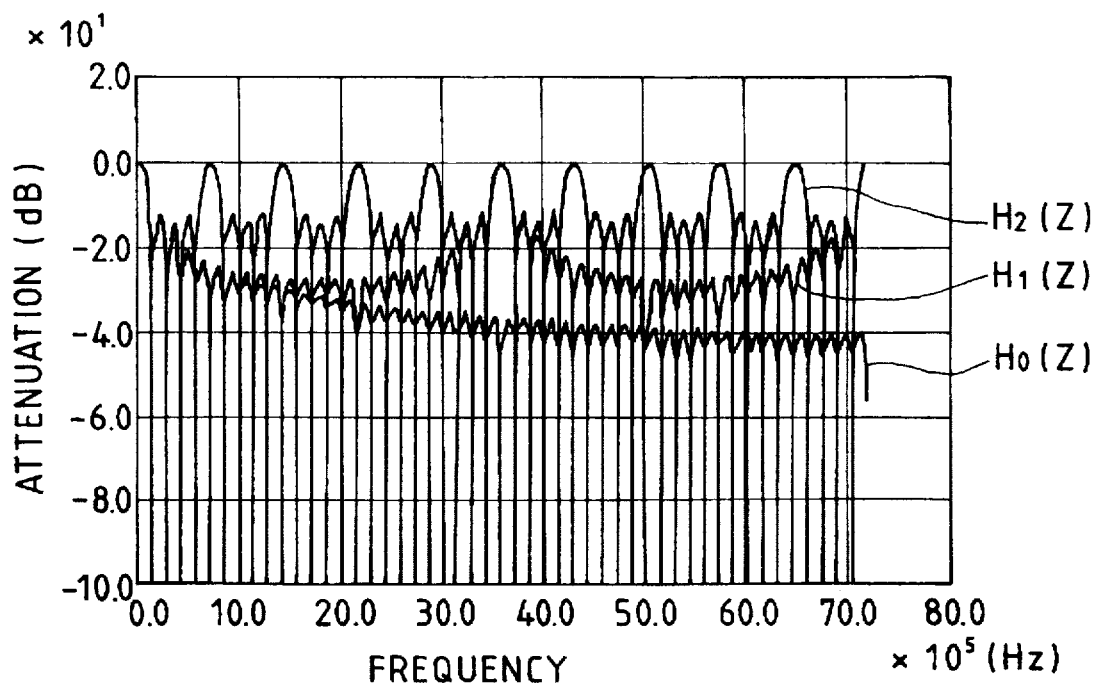
FIG. 6 shows frequency characteristics of respective comb filters that constitute the thinning filter of FIG. 5.
Figure 7:
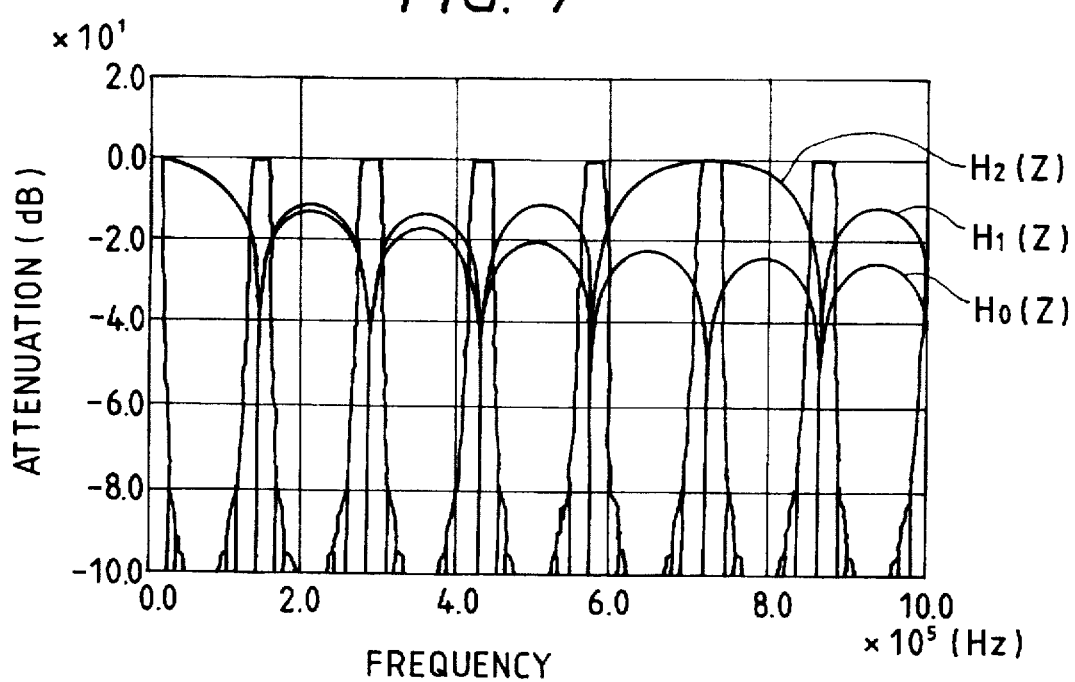
FIG. 7 shows an enlarged portion of FIG. 6.
Figure 8:
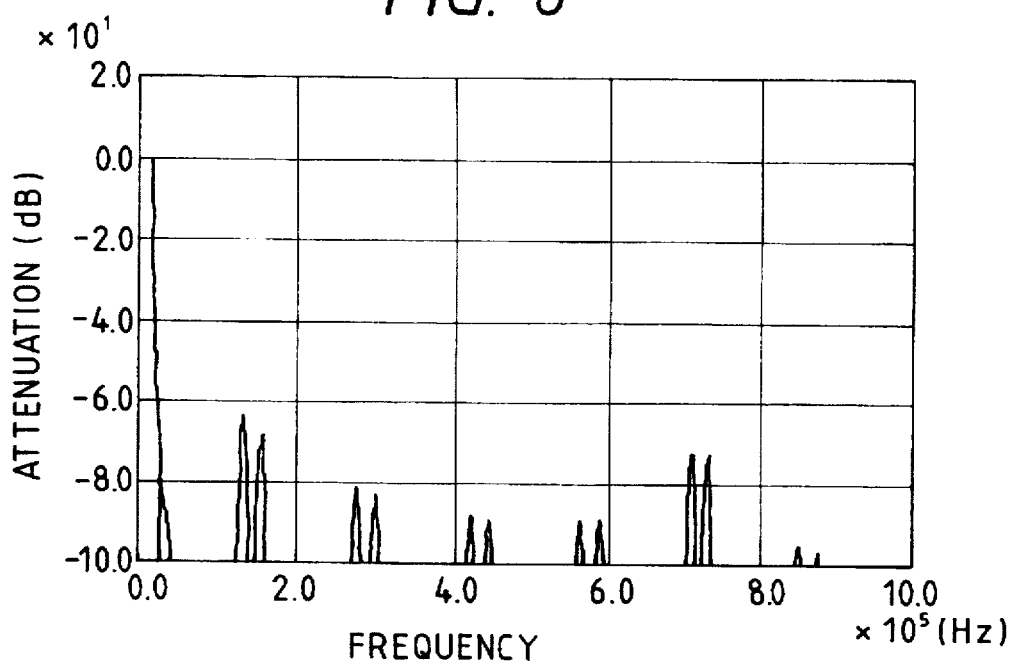
FIG. 8 shows a total characteristic of the thinning filter of FIG. 5.

FIG. 5 shows a specific example of a thinning filter which reduces the frequency from 14.4 MHz to 144 kHz, i.e., 1/100 of the former, by using four stages of comb filters. In this thinning filter, each of the first to third stages employs the comb filter of the first embodiment and the fourth stage $H_3$ employs a DSP. FIG. 6 shows frequency characteristics of the comb filters of the respective stages, and FIG. 7 shows an enlarged portion of FIG. 6. FIG. 8 shows a total characteristic of the thinning filter, which is a cascade connection of the first to fourth stages. It is seen from FIG. 8 that attenuation is attained in a frequency range very close to the target channel (the point indicated by "0.0" on the horizontal axis), particularly at the output sampling frequency 144 kHz. The peaks at the frequencies apart from the target channel can be removed by an analog filter having a gentle characteristic which is disposed upstream of the A/D conversion stage.

Embodiment 2

A second embodiment is directed to a comb filter used in an interpolation filter.

In this embodiment, as shown in FIG. 9B, a comb filter (FIG. 9A) that is used in each stage of a conventional thinning filter can be converted into a cascade connection of a comb filter having a sampling frequency $fs/N_1 \ldots N_{k+1}$ and $N/N_1 \ldots N_{k+1}$ taps (front stage) and a comb filter having a sampling frequency $fs/N_1 \ldots N_k$ and $N_{k+1}$ taps (rear stage). This comb filter can further be converted into a configuration shown in FIG. 9C in which the front-stage comb filter and the 0-insertion element are interchanged.

The front-stage comb filter of FIG. 9C operates at a sampling frequency $fs/N_1 \ldots N_{k+1}$. To eliminate $N/N_1 \ldots N_{k+1}$ times (the number of taps) of additions in one sampling interval, it is converted into a transposed configuration which performs a pipeline operation.

The rear-stage comb filter operates at a sampling frequency $fs/N_1 \ldots N_k$ and has $N_{k+1}$ taps. Since $N_{k+1}-1$ of $N_{k+1}$ input data (samples) from the 0-insertion element are "0", filter output data remains the same for a period of $N_{k+1}$ samples. Therefore, the operation of the rear-stage comb filter is equivalent to a 0th-order hold operation performed on the output of the front-stage comb filter. Thus, the rear-stage comb filter can easily be implemented as a hold circuit such as a flip-flop.

Figure 10:
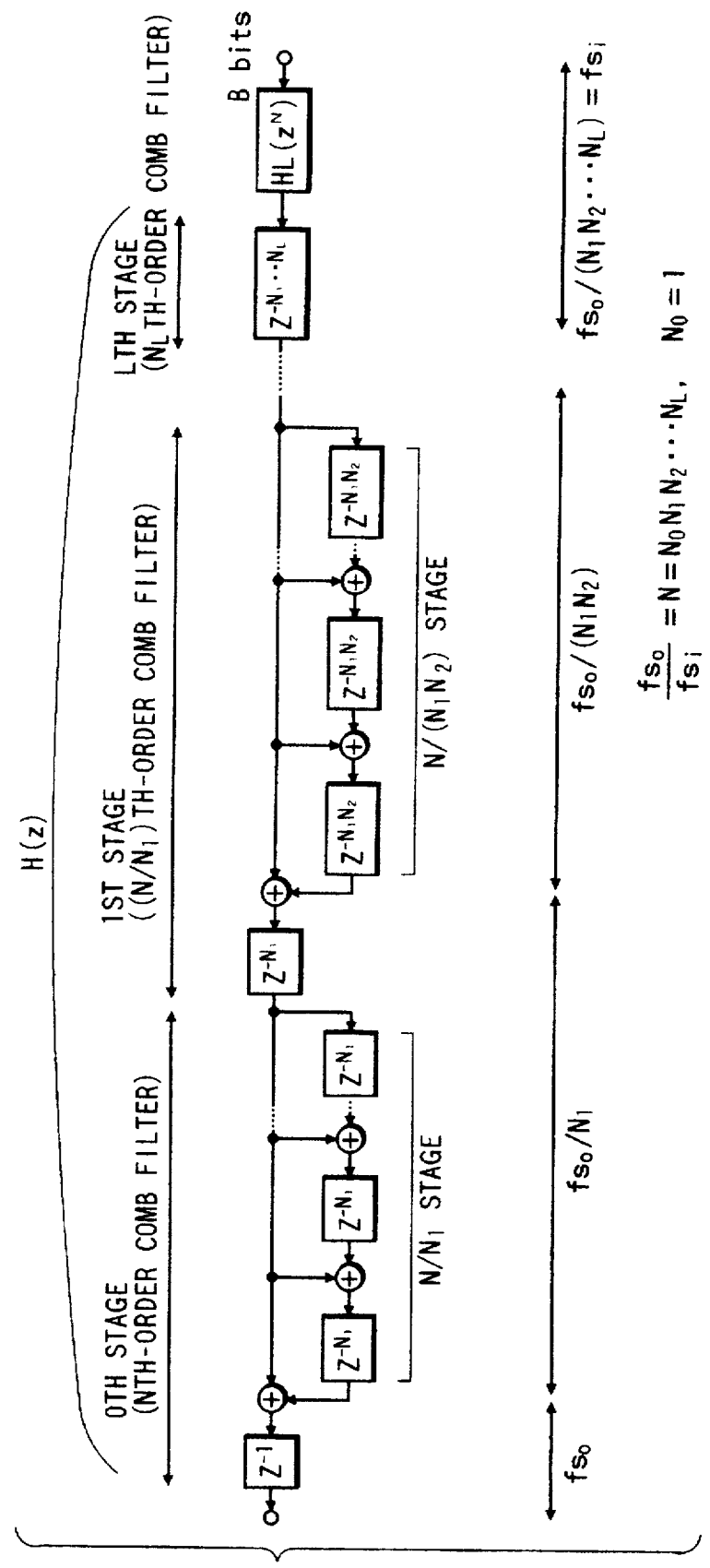
FIG. 10 shows an interpolation filter which uses the comb filters of the second embodiment.

FIG. 10 shows an interpolation filter in which the comb filter of the second embodiment is used in each of the 0th to L-th stages.

Embodiment 3

A third embodiment is directed to a device used in a thinning/interpolation filter of each stage of a transceiver in which the comb filter of the first embodiment (for 1/N thinning) and that of the second embodiment (for N-fold interpolation) are implemented as common hardware and operate in time division.

In TDM transmission or TDD transmission, reception and transmission are effected by transferring burst data at different time points. Therefore, the thinning filter operation during reception and the interpolation filter operation during transmission can be performed by switching the same hardware.

Figure 11:
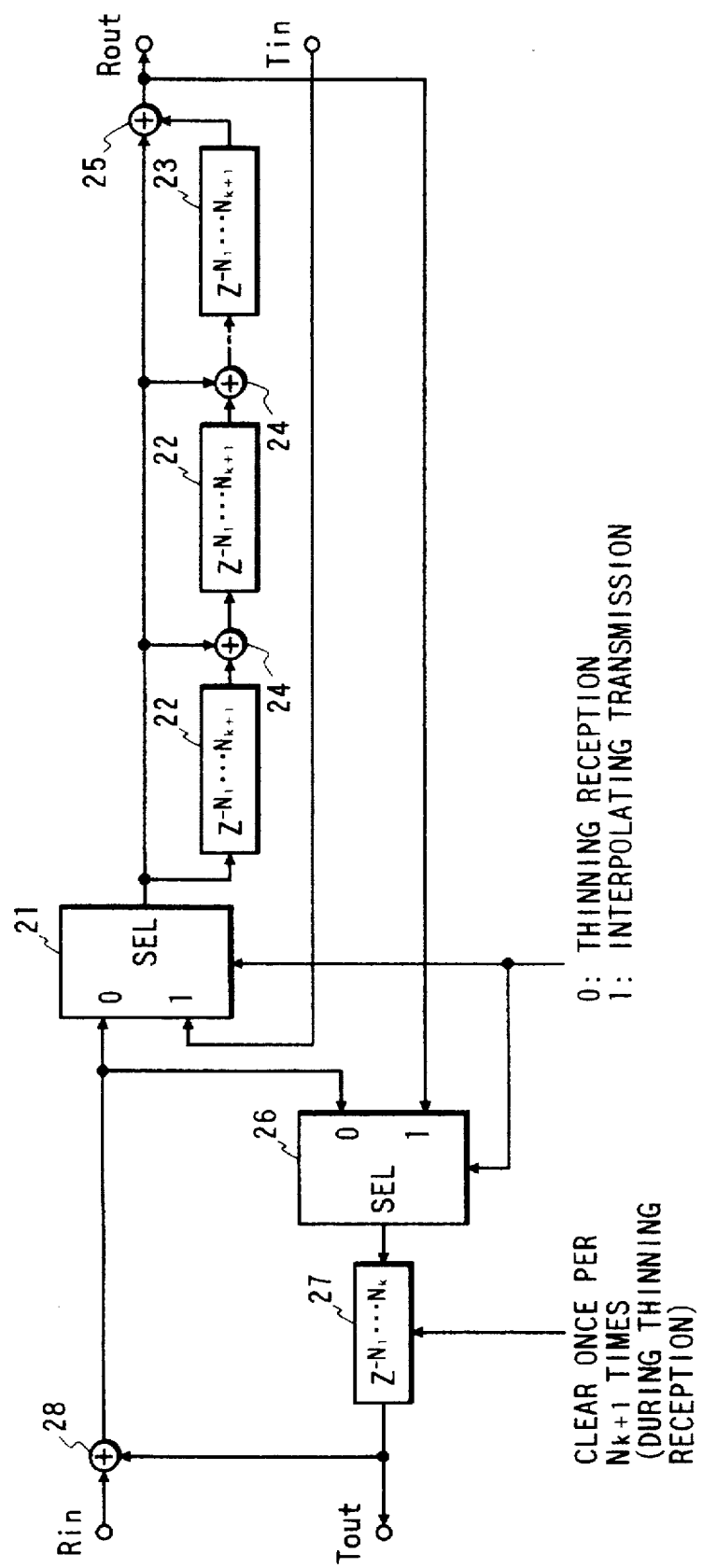
FIG. 11 shows the configuration of each stage of a thinning/interpolation filter of a transceiver according to a third embodiment of the invention.
Figure 13A:
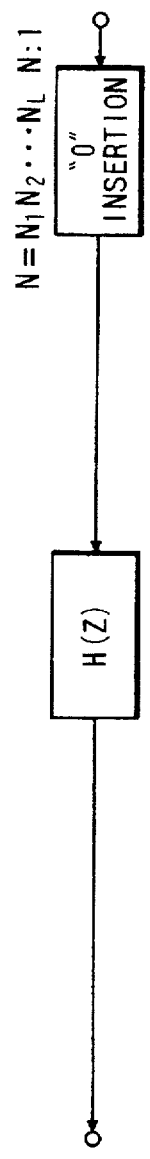
FIGS. 13A–13C show the principle of an interpolation filter.
Figure 13B:
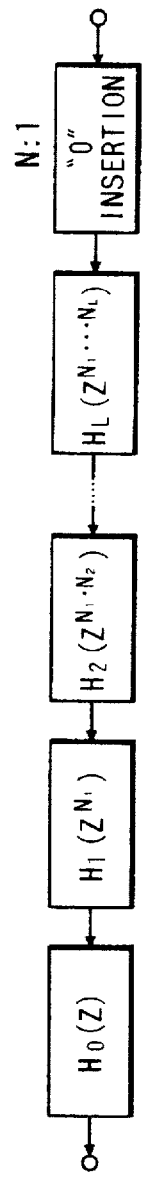
Figure 13C:
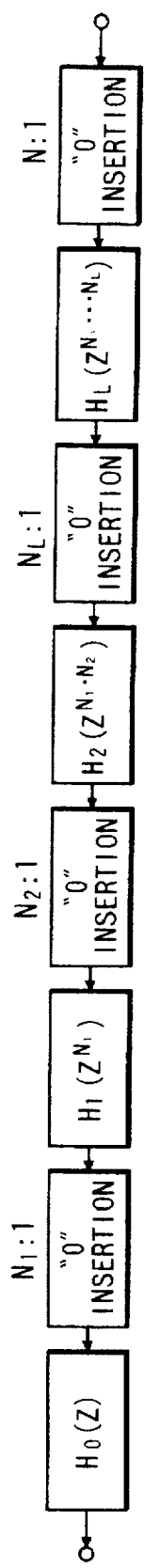
Figure 14:
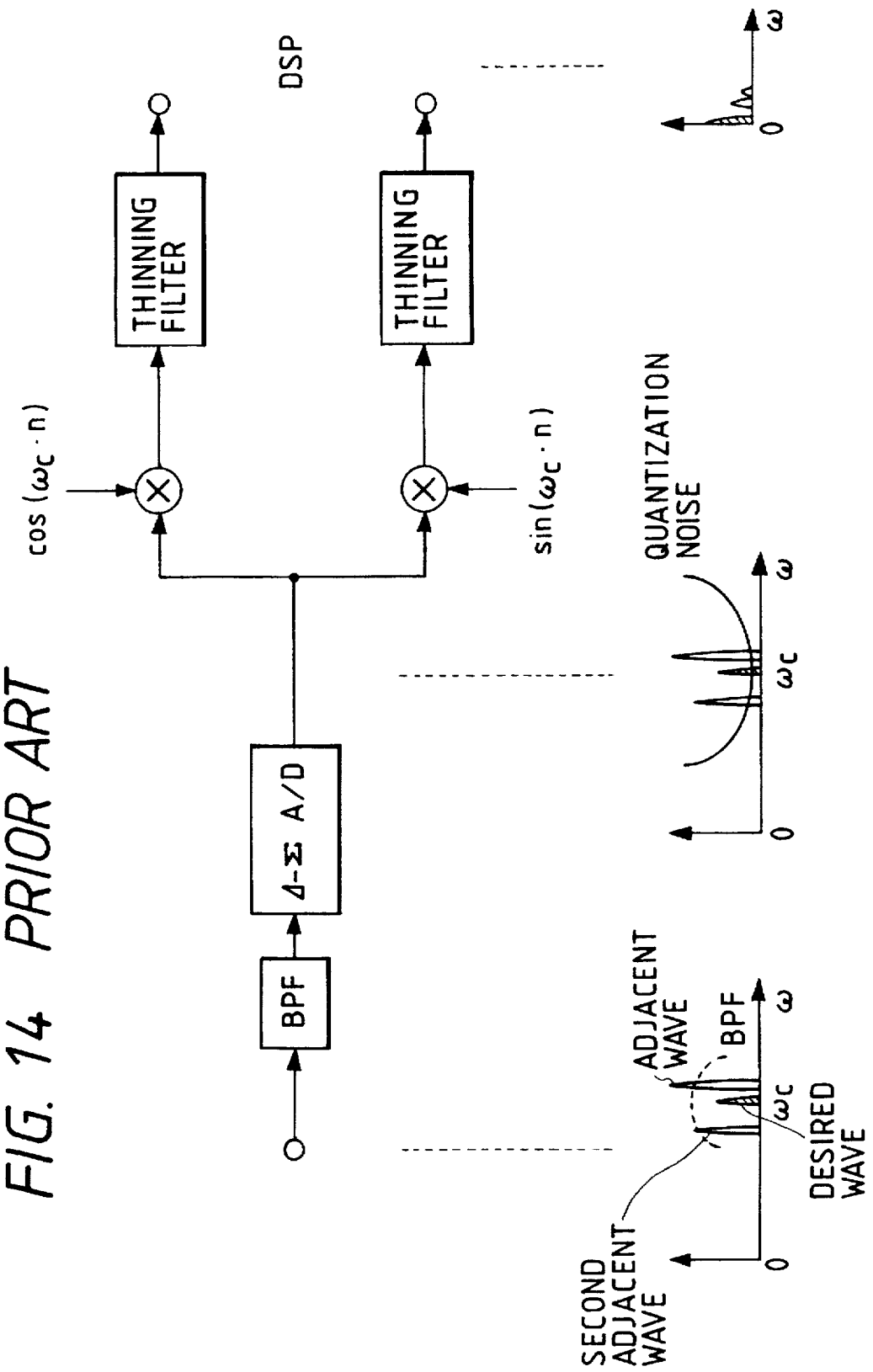
FIG. 14 is a block diagram showing the configuration of a receiving Circuit.
Figure 15:
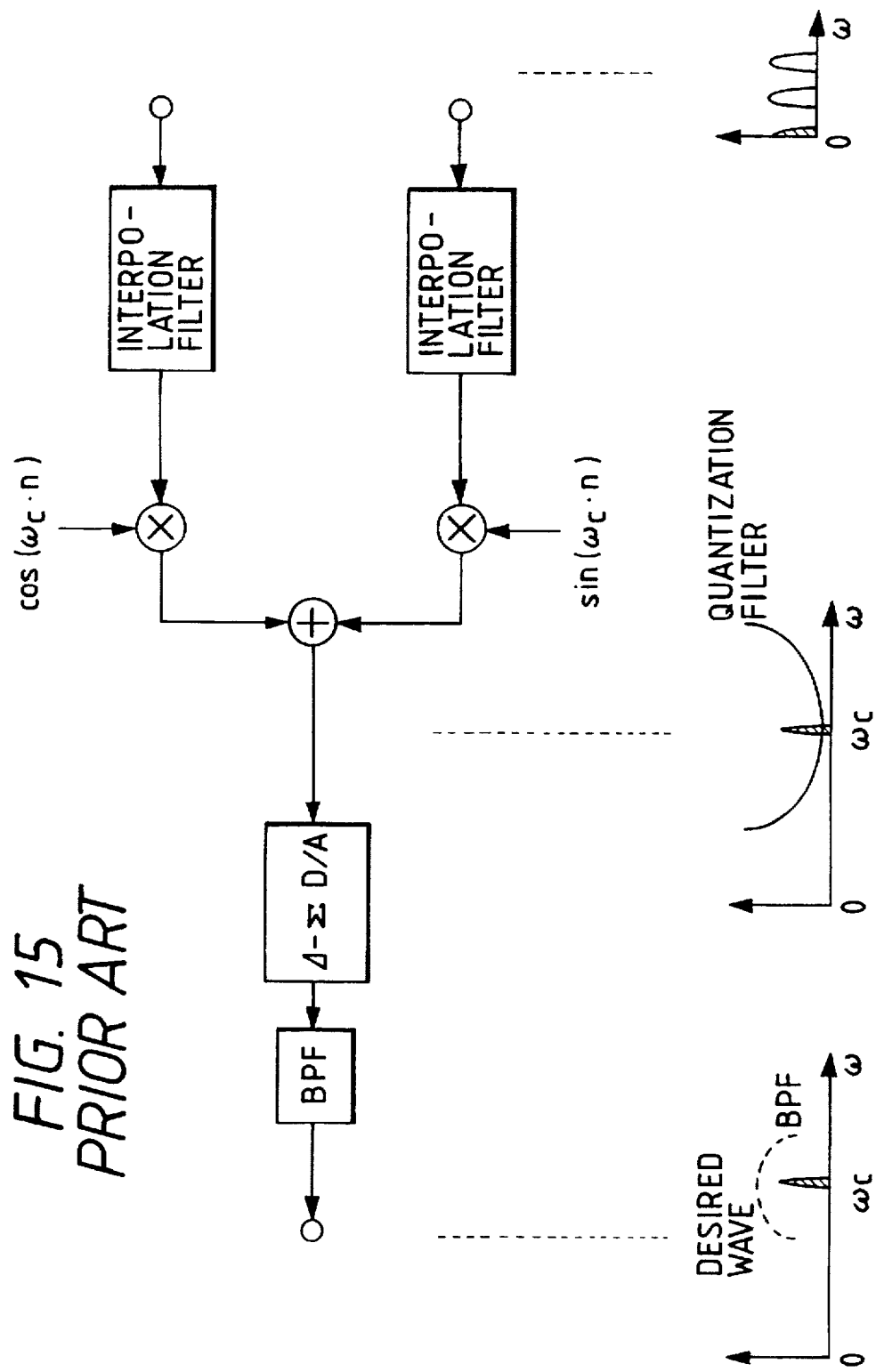
FIG. 15 is a block diagram showing the configuration of a transmitting circuit.
Figure 16:
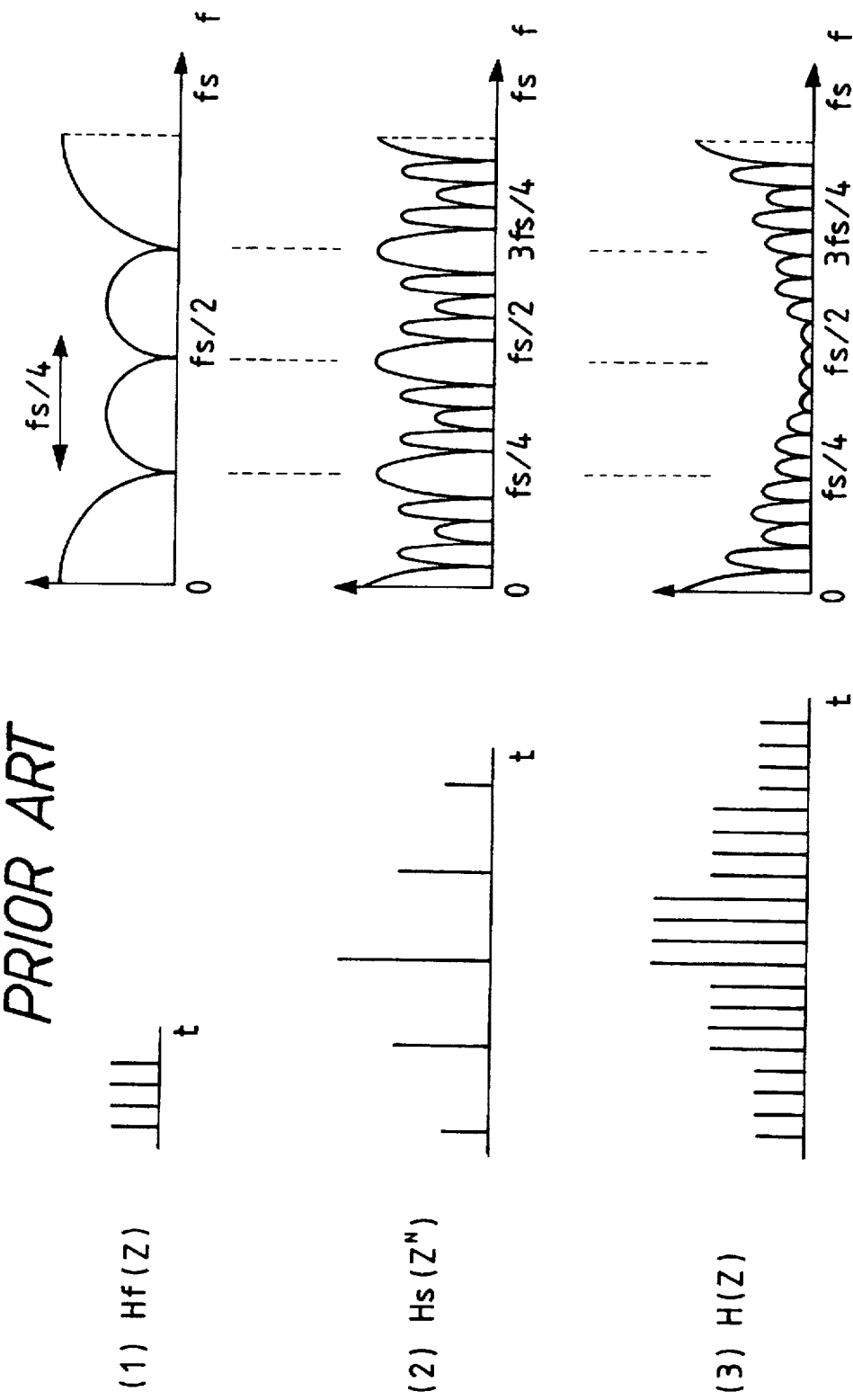
FIG. 16 illustrates a characteristic of a combination of two comb filters.

As shown in FIG. 11, this device includes an adder 28 to which a reception signal Rin is input, selectors 21 and 26 for selecting the thinning reception operation when receiving "0" and selecting the interpolating transmission operation when receiving "1", a digital integrator 27 with a discharge function, and a transposed comb filter consisting of delay elements 22 and adders 24 and 25.

This device operates in the following manner. During reception, the selectors 21 and 26 receive "0" and select the thinning operation. In this case, a reception signal Rin is passed through the adder 28 and the selector 26, and then subjected to addition in the integrator 27. A sum value that is output from the integrator 27 once per $N_{k+1}$ times of additions, is passed through the adder 28 and the selector 21, and input to the transposed comb filter consisting of the delay elements 22 and the adders 24 and 25. Thus, an output signal Rout is obtained from the comb filter.

On the other hand, during transmission, a transmission signal Tin is passed through the selector 21, the transposed comb filter, and the selector 26, and input to the integrator 27, where it is held for a given period. Thus, an output signal Tout is obtained from the integrator 27.

In the above manner, the thinning of sampling data during reception and the interpolation of sampling data during transmission can be performed by the same hardware.

It is noted that the comb filters of the embodiments can be used not only in a transceiver for mobile communication but also in various apparatuses currently employing a comb filter, such as audio-visual products and measuring instruments.

As is apparent from the above description of the embodiments, the comb filter of the invention is low in power consumption, can be implemented in a small chip area, and provides easy-to-produce hardware.

Further, the transceiver in which such a comb filter is commonly used to constitute a thinning filter and an interpolation filter can be implemented as a smaller amount of hardware than in a case there comb filters are separately provided for a thinning filter and an interpolation filter, thus enabling size reduction of an apparatus (transceiver).

What is claimed is:

1. A comb filter for use in a stage associated with a factor $N_k$ of an 1/N thinning filter where N is factorized such that $N=N_1 \ldots N_k \ldots N_L$, comprising:

a digital integrator with a discharge function which is cleared every time it adds up input data for a period of $N_{k+1}$ samples; and a transposed comb filter which is provided downstream of and in cascade to the digital integrator, and operates at $1/N_1 \ldots N_k$ of an input sampling frequency of the thinning filter.

2. A comb filter for use in a stage associated with a factor $N_k$ of an N-fold interpolation filter where N is factorized such that $N=N_1 \ldots N_k \ldots N_L$, comprising:

a transposed comb filter which operates at $1/N_1 \ldots N_k$ of an output sampling frequency of the interpolation filter; and a hold circuit provided in cascade to the transposed comb filter, for holding output data of the transposed comb filter for a period of $N_{k+1}$ samples.

3. A transceiver which repeats receiving and transmitting operations alternately, comprising in a stage associated with a factor $N_k$ of a 1/N thinning/N-fold interpolation filter where N is factorized such that $N=N_1 \ldots N_k \ldots N_L$:

a transposed comb filter which operates at $1/N_1 \ldots N_k$ of a reception or transmission sampling frequency, and which is commonly used for the receiving and transmitting operations;

a digital integrator with a discharge function which acts as an integrator that is cleared every time it adds up input data for a period of $N_{k+1}$ samples during the receiving operation, and acts as a hold circuit for holding output data of the transposed comb filter for a period of $N_{k+1}$ samples during the transmitting operation; and switching means for causing an input signal to flow so as to be supplied first to the digital integrator and then to the transposed comb filter during the receiving operation, and flow in an opposite direction during the transmitting operation.

* * * * *